(12) United States Patent
Kothandaraman (10) Patent No.: US 6,828,652 B2
(45) Date of Patent: Dec. 7, 2004

(54) FUSE STRUCTURE FOR SEMICONDUCTOR DEVICE

(75) Inventor: Chandrasekharan Kothandaraman, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 122 days.

(21) Appl. No.: 10/140,592

(22) Filed: May 7, 2002

(65) Prior Publication Data

US 2003/0209734 A1 Nov. 13, 2003

(51) Int. Cl.⁷ .................... H01L 29/00; H01L 21/8238; H01L 21/331
(52) U.S. Cl. ................ 257/529; 257/530; 257/773; 257/50
(58) Field of Search ................ 257/529, 530, 257/173, 665

(56) References Cited

U.S. PATENT DOCUMENTS

| | | | |
|---|---|---|---|
| 3,959,047 A | | 5/1976 | Alberts et al. |
| 5,420,456 A | | 5/1995 | Galbi et al. |
| 5,519,248 A | * | 5/1996 | Yan et al. .................. 257/530 |
| 5,969,404 A | * | 10/1999 | Bohr et al. .................. 257/529 |
| 6,008,523 A | | 12/1999 | Narayan et al. |
| 6,166,421 A | * | 12/2000 | Kalnitsky et al. ......... 2597/529 |
| 6,242,789 B1 | | 6/2001 | Weber et al. |
| 6,346,721 B1 | | 2/2002 | Schultz |
| 6,432,760 B1 | * | 8/2002 | Kothandaraman et al. .. 438/215 |
| 6,498,056 B1 | * | 12/2002 | Motsiff et al. ............. 438/131 |
| 6,661,330 B1 | * | 12/2003 | Young ........................ 337/297 |
| 2002/0113291 A1 | * | 8/2002 | Adkisson et al. ........... 257/529 |

* cited by examiner

Primary Examiner—Jerome Jackson
Assistant Examiner—Jesse A. Fenty
(74) Attorney, Agent, or Firm—Slater & Matsil, L.L.P.

(57) ABSTRACT

A fuse structure (30) formed in a semiconductor device is provided. The fuse structure (30) includes a layer of fuse material (32), a first contact (40), and a second contact (42). The first contact (40) has a first edge (54). At least a portion of the first edge (54) abuts the fuse material layer (32). The second contact (42) has a second edge (55). At least a portion of the second edge (55) abuts the fuse material layer (32). The first edge (54) faces the second edge (55). The first edge (54) is separated from the second edge (55) by a spaced distance (58). A conductive portion of the fuse material layer (32) electrically connects between the first edge (54) and the second edge (55) within the spaced distance (58). The abutting portion of the first edge (54) has a first length. The abutting portion of the second edge (55) has a second length. The first length is greater than the second length.

27 Claims, 4 Drawing Sheets

FUSE STRUCTURE FOR SEMICONDUCTOR DEVICE

TECHNICAL FIELD

The present invention relates to fuse structures for semiconductor devices. In one aspect, it relates to a programmable fuse structure for use in memory devices.

BACKGROUND OF THE INVENTION

Redundancy in integrated circuit memories is part of many wafer and chip manufacturing strategies to improve yield. By providing redundant memory cells on memory chips for example, integrated circuit memory yields may be increased by eliminating from circuit operation the circuits or modules that are defective or that are not needed. The typical practice is to blow fuses or fray connections at fuses to alter the active cells or circuits, which allows redundant memory cells to be used in place of cells that are not functional. Such practice is often referred to as "programming the fuses."

It is also common practice to use fuses to customize chips and modules after the production of the chip. Hence, one chip configuration may be used for multiply applications by programming the fuses (i.e., blowing or rupturing certain fuses) to deactivate selected circuit paths. Thus, a single integrated circuit design may be economically manufactured and adapted to a variety of custom uses.

Figure 1:
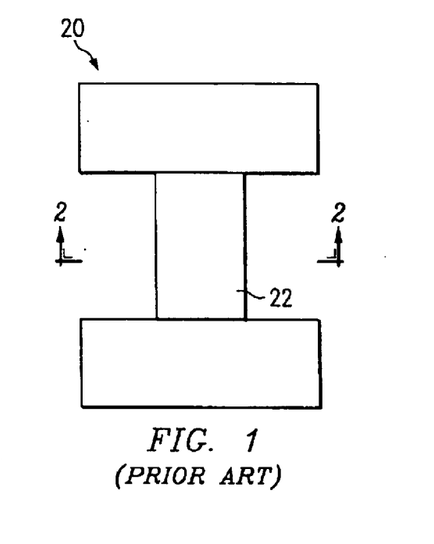
FIG. 1 is a top view of a fuse structure of the prior art.
Figure 2:
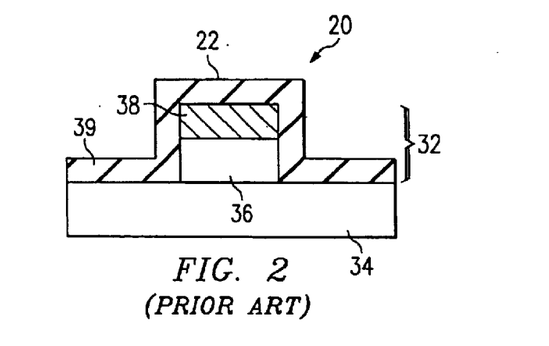
FIG. 2 is a sectional view of FIG. 1 taken along line 2—2.

Typically, fuses or fusible links are incorporated in an integrated circuit design, and then these fuses or fusible links are selectively blow or ruptured by passing an electrical current of sufficient magnitude through the selected fuses to cause them to melt and break the connection. A common design for such fuses is a fuse structure 20 having a straight link with a necked section 22, as shown in FIGS. 1 and 2, for example. The necked section 22 causes high current concentrations or "current crowding" where the dimensions of the fuse structure 20 are abruptly reduced at the necked section 22, which is sometimes referred to as the fuse link.

In the past fuses were often blown or ruptured by various means. But currently the preferred mechanism for opening the connection at the fuse is by electromigration because electromigration often provides more reliable and repeatable results than merely rupturing the link. Electromigration is the migration of atoms along the direction of electron flow (i.e., in the opposite direction of the current flow).

U.S. Pat. No. 5,420,456 discloses a z-shaped fuse structure, often referred to as a ZAG fuse, which uses a series of sharp angles (e.g., right angles) in the current path, like a chicane, to generate current crowding at the sharp corners. As the current tries to flow through the chicane-like structure, it crowds at the inside of the corners and generates heat in a very concentrated location. The increase in current density at these concentrated locations generates heat, which causes the fuse to melt open when a certain level of current is passed therethrough. Thus, instead of using a necked section, the ZAG fuses use a chicane section for obstructing the current flow and generating current crowding.

The necked fuses and ZAG fuses worked fine for prior circuits. However, because the patterning of circuit structures have shrunk to submicron levels in their dimensions, the width of the fuse links are now on the order of the grain size for the materials used in the fuses. Thus, there is much more fluctuation in the grain structures among the fuses, which results in variations in the resistance. It is desirable to have consistent resistance for a given fuse design so that the results of programming the fuses in a circuit are consistent. Therefore, as the dimensions of circuits have shrunk to the submicron levels, the prior ways of configuring a fuse structure are becoming less satisfactory due to the variations in resistances and inconsistencies among resulting fuse structures of the same design and dimensions. Hence, there is a need for a fuse structure that provides more consistent resistance for circuits being designed and produced at submicron levels.

In addition to circuits becoming smaller, the voltage and current levels for circuits also tend to decrease for reducing power consumption and to increase circuit speeds, for example. As voltage levels and current levels decrease for circuit designs, the voltage and current levels required to program fuses need to decrease as well, which often means a decrease in fuse structure dimensions. Hence, there is a need for a fuse structure that can be programmed at lower voltage and current levels, but without suffering from decreased resistance level consistency due to decreased dimensions.

Furthermore, the real estate on a chip continues to be a valuable commodity as the size of circuits and devices continue to shrink. Thus, there continues to be a need for fuse structures that use less real estate space on the chip. The ZAG design disclosed in U.S. Pat. No. 5,420,456 addresses this issue with its improved design. However, as the circuits continue to progress into submicron levels in size of components, the ZAG design will likely become less favorable because it will also suffer from the problem of inconsistent resistance due to the fuse structure dimensions being on the order of the grain structure for the fuse materials. Hence, there is a need for a fuse structure that can be programmed at lower voltage and current levels and that provides more consistent resistance values, as compared to existing fuse designs, while also being an efficient use of chip real estate space.

SUMMARY OF THE INVENTION

The problems and needs outlined above are addressed by certain aspects of the present invention. In accordance with one aspect of the present invention, a fuse structure formed in a semiconductor device is provided. The fuse structure includes a layer of fuse material, a first contact, and a second contact. The first contact has a first edge. At least a portion of the first edge abuts the fuse material layer. The second contact has a second edge. At least a portion of the second edge abuts the fuse material layer. The first edge faces the second edge. The first edge is separated from the second edge by a spaced distance. A conductive portion of the fuse material layer electrically connects between the first edge and the second edge within the spaced distance. The abutting portion of the first edge has a first length. The abutting portion of the second edge has a second length. The first length is greater than the second length.

In accordance with another aspect of the present invention, a programmable fuse structure formed in a semiconductor device is provided. The programmable fuse structure includes layer of fuse material, an anode contact, and a cathode contact. The layer of fuse material is substantially rectangular shaped. The anode contact at least partially borders a first area of the fuse material layer. The anode contact has an inner edge. At least a portion of the inner anode edge abuts the fuse material layer. The cathode contact is formed on the fuse material layer. The cathode contact covers a second area of the fuse material layer. The second area is at least partially surrounded by the first area of the fuse material layer. The cathode contact has an outer edge that faces at least part of the inner anode edge. At least a portion of the outer edge abuts the fuse material layer. The abutting portion of the outer cathode edge is separated from the abutting portion of the inner anode edge by a spaced distance. The abutting portion of the inner anode edge is electrically coupled to the abutting portion of the outer cathode edge via a conductive portion of the fuse material layer. The conductive portion of the fuse material layer is within the spaced distance.

In accordance with yet another aspect of the present invention, a fuse structure for use in a semiconductor device is provided. The fuse structure includes a layer of fuse material, an anode contact, and a cathode contact. The anode contact has a polygon-shaped outer edge and a polygon-shaped inner edge. At least a portion of the inner anode edge abuts the fuse material layer. The inner anode edge borders a first area of the fuse material layer. The abutting portion of the inner anode edge has a first length. The cathode contact has a polygon-shaped outer edge. The cathode contact is bordered by the first area of the fuse material layer. At least a portion of the outer cathode edge abuts the fuse material layer. The abutting portion of the outer cathode edge has a second length. The abutting portion of the inner anode edge is electrically coupled to the abutting portion of the outer cathode edge via a conductive portion of the fuse material layer within in the first area. The first length is greater than the second length.

In accordance with still another aspect of the present invention, a programmable fuse structure for use in a semiconductor device is provided. The programmable fuse structure includes a layer of fuse material, a first contact, and a second contact. The first contact has a first edge. At least a portion of the first edge abuts the fuse material layer. The abutting portion of the first edge has a first length. The second contact has a second edge. At least a portion of the second edge abuts the fuse material layer. The abutting portion of the second edge has a second length. A length across the fuse material layer along its upper surface in any direction is equal to or greater than the second length of the second contact. The first length is greater than the second length.

In accordance with another aspect of the present invention, a synchronous dynamic random access memory (SDRAM) device is provided. The SDRAM includes a memory array, a plurality of redundant memory cells, a clock circuitry, a row address buffer, a column address buffer, a decode circuitry, and a fuse circuit. The memory array includes a plurality of memory cells arranged in rows and columns. Each memory cell includes a capacitor coupled in series with a transistor. Each redundant memory cell includes a capacitor coupled in series with a transistor. The row address buffer is coupled to receive data at a time related to a clock signal received at the clock circuitry. The column address buffer is coupled to receive data at a time related to a clock signal received at the clock circuitry. The decode circuitry is coupled to the row address buffer and/or the column address buffer. The decode circuitry is also coupled to the memory array and the plurality of redundant memory cells. The fuse circuit is coupled with the decode circuitry. The fuse circuit includes first and second contacts abutting a layer of fuse material. The first contact has a first edge facing an edge of the second contact. The abutting portion of the first contact edge has a first length and the abutting portion of the second edge has a second length. The first length is greater than the second length.

BRIEF DESCRIPTION OF THE DRAWINGS

Other objects and advantages of the invention will become apparent upon reading the following detailed description and upon referencing the accompanying drawings, in which.

DETAILED DESCRIPTION OF PREFERRED EMBODIMENTS

Referring now to the drawings, wherein like reference numbers are used to designate like elements throughout the various views, several embodiments of the present invention are further described. The figures are not necessarily drawn to scale, and in some instances the drawings have been exaggerated or simplified for illustrative purposes only. One of ordinary skill in the art will appreciate the many possible applications and variations of the present invention based on the following examples of possible embodiments of the present invention.

Figure 3:
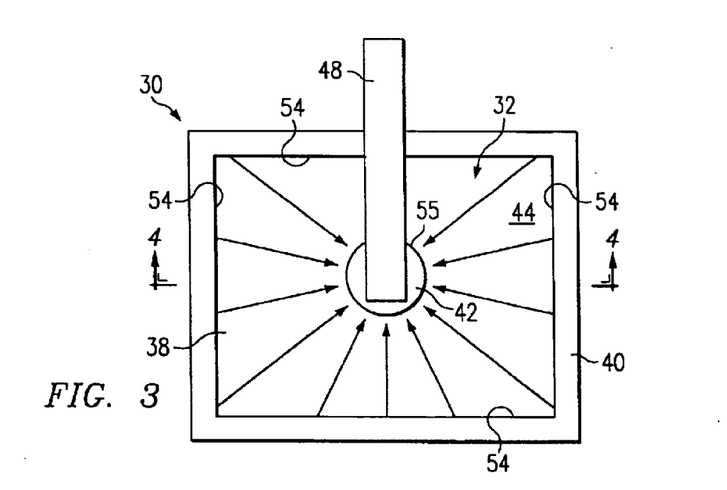
FIG. 3 is a top view of a first embodiment of the present invention.
Figure 4:
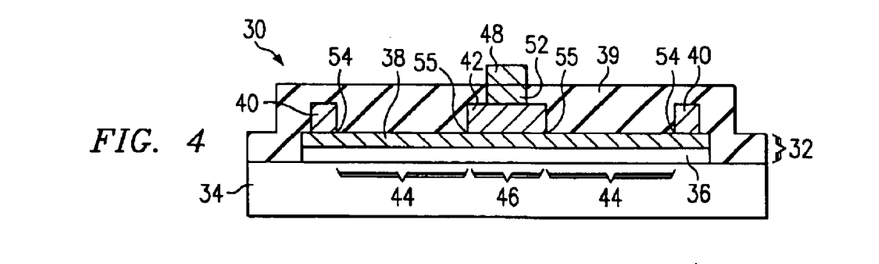
FIG. 4 is a sectional view of FIG. 3 taken along line 4—4.

The present invention generally relates to fuse structures for semiconductor devices. FIGS. 3 and 4 show a fuse structure 30 in accordance with a first embodiment of the present invention. FIG. 3 is a top view of the first embodiment. FIG. 4 is a sectional view as taken along line 4—4. The fuse structure 30 of the first embodiment has a layer of fuse material 32 formed on a substrate 34 or surface of a semiconductor device. In the example shown in FIGS. 3 and 4, the fuse material layer 32 may be formed on a layer of insulation material 34 in a shallow trench isolation (STI) zone, for example, and the semiconductor device may be a synchronous dynamic random access memory (SDRAM), for example, with redundant cells (not shown) that may be used when a series of the fuse structures 30 are programmed. The insulation layer may be silicon nitride or silicon dioxide, for example. Also, the insulation layer may be formed from an organic compound. One of ordinary skill in the art will realize that there are numerous other insulation materials that may be substituted into an embodiment of the present invention.

In the first embodiment, the fuse material layer 34 comprises two stacked layers. The first layer 36 of the fuse material layer 34 may be polysilicon, for example, and the second layer 38 may be a metal silicide, for example, including but not limited to cobalt silicide, titanium silicide, tungsten silicide, tantalum silicide, and platinum silicide. Also, the fuse material layer may be a single layer of metal or metal compounds of suitable resistivity, including but not limited to aluminum, tungsten, and chromium, for example. Such materials are often used for forming fuse links. For example, the fuse link 22 for the fuse structure 20 of FIGS. 1 and 2 comprises the same fuse material, as best shown in FIG. 2. In other embodiments however, the choice of fuse materials and the number of layers (e.g., 1 layer, 2 layers, 3 layers, etc.) may vary. One of ordinary skill in the art will realize that there are numerous other materials that may be substituted into an embodiment of the present invention for the fuse material layer. An insulation layer 39 covers the fuse material layer 32, as is typically done in fuse structures (e.g., see FIGS. 1 and 2). Note that in FIG. 3 the insulation layer 39 is not shown for illustration purposes.

An anode contact 40 and a cathode contact 42 are formed on the fuse material layer 32, as shown in FIGS. 3 and 4. As best seen in FIG. 3, the anode contact 40 surrounds and borders a first area 44 of the fuse material layer 32, i.e., area 44 between the cathode contact 42 and the anode contact 40. The cathode contact 42 is located at a central region of the fuse material layer 32 and covers a second area 46 (directly beneath the a cathode contact 42) of the fuse material layer 32, which is surrounded by the first area 44 in this case. Note that the first area 44 is larger than the second area 46. The anode contact 40 is electrically coupled to the cathode contact 42 via the fuse material layer 32. Thus, current traveling from the anode contact 40 to the cathode contact 42 must travel through the fuse material layer 32.

A cathode connector line 48 is electrically coupled to the cathode contact 42 and extends from the cathode contact 42 to a location outside of the first area 44 of the fuse material layer 32. Hence, the cathode connector 48 electrically couples the cathode contact 42 to other parts of the integrated circuit (not shown). As best shown in FIG. 4, the cathode contact 42 and the anode contact 40 are formed on the same level, and the insulation layer 39 is formed over the anode contact 40. The insulation layer 39 separates the anode contact 40 from the cathode connector 48 because the cathode connector 48 is formed on the insulation layer 39. Hence, the cathode connector 48 in the first embodiment is formed on a different level above the level comprising the anode contact 40 and cathode contact 42. As also shown in FIG. 4, the cathode contact 42 is electrically coupled to the cathode connector 48 by a via 52 formed through the insulation layer 39. But as illustrated by other embodiments shown herein and discussed below, the cathode connector 48 may be on the same level as the anode and cathode contacts 40, 42.

Due to the configuration of the fuse structure 30 (see FIG. 3), an inner edge 54 of the anode contact 40, which abuts the fuse material layer 32, is inherently longer than an outer edge 55 of the cathode contact, which also abuts the fuse material layer 32. When current travels from the anode contact 40 to the cathode contact 42 via the fuse material layer 32, most of the current will go from the inner anode edge 54 to the outer cathode edge 55 because it is the shortest path of least resistance. Due to the geometric configuration of the first embodiment, when current travels from the inner anode edge 54 to the outer cathode edge 55, current crowding (i.e., increase in current density) will occur at the outer cathode edge 55, as illustrated by the arrows representing current flow in FIG. 3.

When the current level is large enough, current crowding around the cathode contact 42 at the outer cathode edge 55 may cause the phenomenon of electromigration. Electromigration is the movement or transport of atoms along the direction of electron flow (i.e., in the opposite direction of the current flow). Such migration of atoms reduces the cross-section area for that region, which causes higher resistance and heating in that region. If the current level remains about the same or further increases, the electromigration may further propagate, causing the cross-sectional area to be further reduced, to the point where the electrical resistance becomes so high that the region experiencing the electromigration will effectively block current flow, or in a more extreme case, the heat generated at that region may melt the material and/or rupture the connection to cause an void of material that will block current flow. The thinning or voiding of a region due to electromigration can create an open connection or a disconnect that prohibits current flow through the effected region. This electromigration phenomenon may be controllably induced in a fuse structure 30 when programming fuses in a circuit. In integrated circuits, electromigration is generally the preferred way to open a fuse connection as compared to rupturing a fuse connection with heat because rupturing a fuse connection with rapid heat generation may damage surrounding circuit components. Whereas, electromigration is often a more controllable way to open a fuse connection.

Referring again to FIGS. 3 and 4, the fuse structure 30 of first embodiment can be controllably opened during the programming of the fuses using electromigration. As the current crowds around the cathode contact 42 (due to the geometry and configuration of the fuse structure 30), the electromigration phenomenon causes atoms of the fuse material layer 32 to migrate away from the outer cathode edge 55 and generally towards the anode contact 40. Such migration causes thinning of the fuse material layer 32 concentrically about the cathode contact 42 where the current enters the cathode contact 42 at the outer cathode edge 55. The electromigration thus causes an increase in the resistance for current flowing through the fuse structure 30. Often it is not necessary to rupture the fuse connection (i.e., create a void area in the fuse material layer 30) while programming the fuse structure 30. The increased resistance caused by electromigration is often enough to effectively "open the fuse" for purposes of programming the fuse structure.

An embodiment of the present invention has an advantage of providing a fuse structure 30 with a more repeatable and consistent resistance, as compared to fuse structures 20 of the prior art (e.g., as shown in FIGS. 1 and 2), for integrated circuits having component dimensions on the submicron level. As discussed above, patterning of fuse links at submicron dimensions yields less consistent resistance and less repeatable fuse opening conditions as the size of the fuse links continue to shrink along with circuit dimensions. Because the fuse material layer 32 of the first embodiment is configured in a thin layer, the configuration and dimensions for forming the fuse material layer 32 are not as small as those of a typical patterned fuse link 22 (compare to FIG. 1). Thus, the reliability problems associated with patterning fuse links of the prior art are addressed by embodiments of the present invention.

Figure 5:
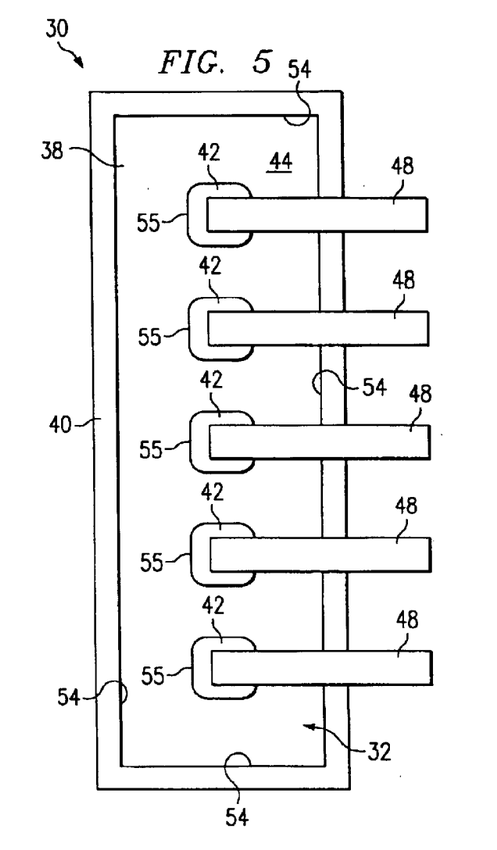
FIG. 5 is a top view of a second embodiment of the present invention.

FIG. 5 shows a second embodiment of the present invention. FIG. 5 is similar to the first embodiment of FIGS. 3 and 4, except that there are multiple cathode contacts 42 for one anode contact 40. Hence, the fuse structure 30 of the second embodiment forms five fuses for five different cathode contacts 42 using a single fuse material layer 32 and a single anode contact 40 bordering the fuse material layer 32. As in FIGS. 3 and 4, the additional insulation layer 50 separating the cathode connectors 48 from the anode contact 40 is not shown, for purposes of illustrating other components of the fuse structure 30. If two of the fuses of the fuse structure 30 are to be opened while the others remain connected, for example, during programming of the circuit, current crowding around the cathode contacts 42 for the two fuses to be opened will cause electromigration of material away from those two cathode contacts. The other three fuses will remain connected and essentially unchanged, while a void will be formed around the two cathode contacts 42 of the opened fuses. Thus, multiple fuses may be formed within a fuse structure 30.

Figure 6:
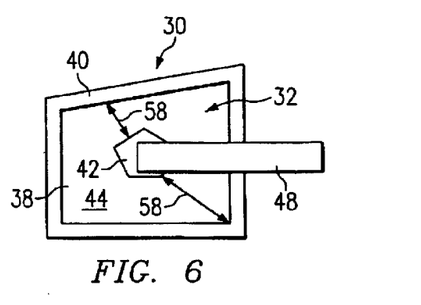
FIG. 6 is a top view of a third embodiment of the present invention.
Figure 7:
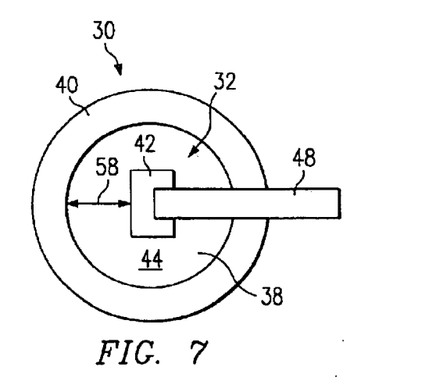
FIG. 7 is a top view of a fourth embodiment of the present invention.
Figure 8:
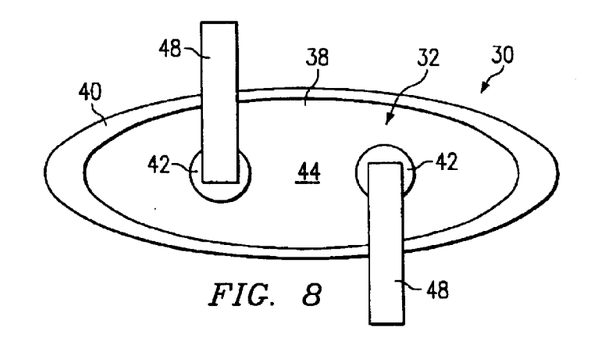
FIG. 8 is a top view of a fifth embodiment of the present invention.

In FIG. 5 the insulation layer 39 that covers the fuse material layer 32 and the anode contact 40, and which separates the anode contact 40 from the cathode connector 48, is not shown in for purposes of illustration. Note also that the cathode contacts 42 of the second embodiment (FIG. 5) are generally square with rounded corners, as compared to the round-shaped cathode contact 42 of the first embodiment (FIG. 3). Typically components of integrated circuits are formed with squared or rectangular geometries. However, when relatively small features are formed, such as the cathode contacts 42, such square or rectangular features often end up having rounded corners. However, for an embodiment of the present invention, the shape of the cathode contact(s) 42 and the anode contact 40 may vary. FIGS. 6–8 show a third, fourth, and fifth embodiment, respectively, of the present invention. The embodiments of FIGS. 6–8 further illustrate that the shape of the cathode contact(s) 42 and/or the anode contact 40 may vary. The shape of the cathode contact(s) 42 and the anode contact 40 may be any shape, including polygonal and arbitrary shapes. In FIGS. 6–8 the insulation layer 39 that covers the fuse material layer 32 and the anode contact 40, and which separates the anode contact 40 from the cathode connector 48, is not shown in for purposes of illustration.

Another design criteria of an embodiment of the present invention that may be varied is the spaced distance 58 (e.g., see FIG. 7) between a cathode contact 42 and its corresponding anode contact 40. In general, there will be a range of spaced distances that will be most favorable, as well an optimum distance. For an embodiment of the present invention where the anode contact 40 is generally radially displaced from the cathode contact 42 with the fuse material layer 32 therebetween, the spaced distance 58 will generally correspond to the length of the inner anode edge 54. For many configurations, as the spaced distance 58 (or generally radial distance) between the cathode contact 42 and the anode contact 40 increases, the length of the inner anode edge 54 increases relative to the length of the outer cathode edge 55. Thus for many configurations, as the spaced distance 58 (or generally radial distance) between the cathode contact 42 and the anode contact 40 increases, the effective current crowding at the outer cathode edge 55 will increase. As the radial distance between the cathode contact 42 and the anode contact 40 increases, the amount of current needed to change the state of the fuse or program the fuse structure 30 (i.e., open the fuse) will increase and the initial resistance of the fuse material layer 32 will increase. As the radial distance between the cathode contact 42 and the anode contact 40 decreases, the initial resistance decreases, but the ability to program or open the fuse becomes more difficult due to heat loses in the contacts, which are typically good heat conductors (e.g., metal). Hence, there is a range of distances 58 between the cathode contact 42 and the anode contact 40 that will be feasible and there is an optimum distance within that range for a given circuit design (e.g., circuit voltage and current levels). For example in the first embodiment, the optimal distance between the cathode contact 42 and the anode contact 40 may be on the order of about one to ten microns.

Figure 9:
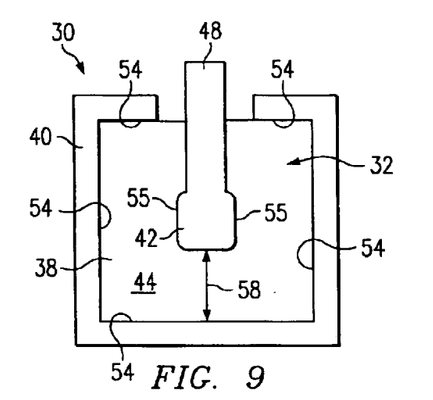
FIG. 9 is a top view of a sixth embodiment of the present invention.

FIG. 9 shows a sixth embodiment of the present invention. The sixth embodiment (FIG. 9) is similar to the first embodiment (FIG. 3), except that the anode contact 40 does not completely border and enclose the first area 44 of the fuse material layer 32. In the sixth embodiment of FIG. 9, the cathode connector 48, cathode contact 42, and anode contact 40 are formed on the same level. Hence, there is not a need for an insulation layer 39 between the cathode connector 48 and the anode contact 40, as in the first embodiment. Note that in FIG. 9 the insulation layer 39 that may cover the fuse material layer 32, the anode contact 40, the cathode contact 42, and the cathode connector 48 is not shown in for purposes of illustration.

Figure 10:
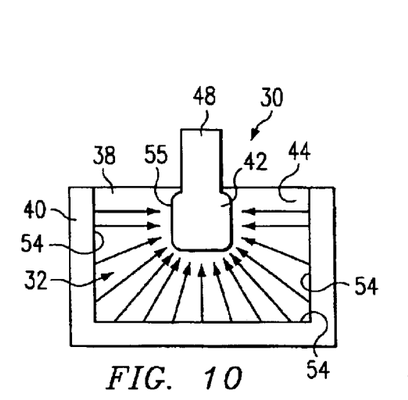
FIG. 10 is a top view of a seventh embodiment of the present invention.

FIG. 10 shows a seventh embodiment of the present invention. The seventh embodiment (FIG. 10) is similar to the sixth embodiment (FIG. 9), except that the anode contact 40 is U-shaped and bordering only three sides of the fuse material layer 32. Also, the cathode contact 42 of the seventh embodiment is not centrally located (in a top view) within the fuse material layer 32, but rather is located on one side near the edge of the fuse material layer 32. But due to the geometry and configuration of the contacts 40, 42, there is still current crowding as the current enters the cathode contact 42, as illustrated by the arrows representing the current flow in FIG. 10. Note that in FIG. 10 the insulation layer 39 that may cover the fuse material layer 32, the anode contact 40, the cathode contact 42, and possibly part of the cathode connector 48 is not shown in for purposes of illustration.

Figure 11:
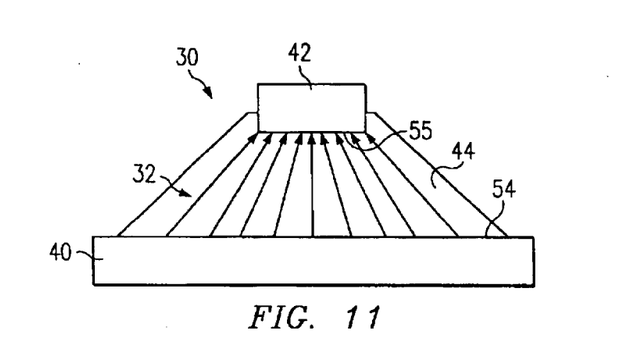
FIG. 11 is a top view of an eighth embodiment of the present invention.
Figure 12:
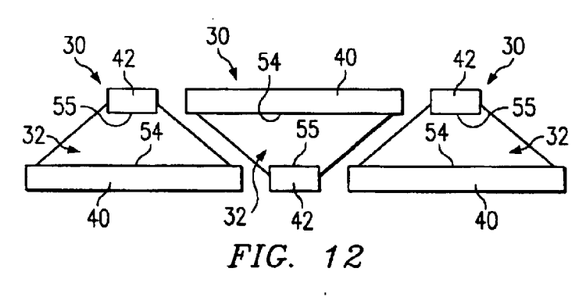
FIG. 12 is a top view of a series of fuse structures in accordance with the eighth embodiment.

FIG. 11 shows an eight embodiment of the present invention. In the eighth embodiment, the fuse material layer 32 is trapezoidal shaped, the anode contact 40 is located at the base of the trapezoid shape (i.e., larger side in top view) of the fuse material layer 32, and the cathode contact 42 is located at the top of the trapezoid shape (i.e., smaller side in top view) of the fuse material layer 32. However in alternative, the fuse material layer 32 may be rectangular shaped, for example, instead of trapezoidal shaped to form another embodiment. A criteria is that the inner anode edge 54 is longer than the outer cathode edge 55. Hence, the anode contact 40 in FIG. 11 is much longer than the cathode contact 42, which results in current crowding at the cathode contact 42, as illustrated by the arrows in FIG. 11 representing the current flow and the change in current density. FIG. 12 illustrates how a series of fuse structures 30 in accordance with the eight embodiment of FIG. 11 may be configured in a space saving manner on a chip. Note that in FIGS. 11 and 12 the insulation layer 39 that may cover the fuse material layer 32, the anode contact 40, and the cathode contact 42 is not shown in for purposes of illustration.

As illustrated by the example embodiments shown in FIGS. 3–12, an embodiment of the present invention may have a variety of configurations and shapes. Therefore with the benefit of this invention disclosure, one of ordinary skill in the art may realize and choose from many other possible shapes and configurations that are possible for other embodiments and applications of the present invention.

There are numerous semiconductor devices in which the present invention may be incorporated into, including but not limited to: a programmable read only memory (PROM) device; a dynamic random access memory (DRAM) chip; a synchronous DRAM (SDRAM) chip; a DRAM having a multiplexed bus, such as those licensed by Rambus, Inc.; an SDRAM having double-data-rate (DDR) features and functions; or static RAM (both synchronous (SRAM) and asynchronous), for example. A fuse embodiment of the present invention may be used in an application where there is a need to permanently "write" or program information, such as in PROMs, for example. With the benefit of this invention disclosure, those of ordinary skill in the art will likely realize other applications of the present invention. Also, the present invention may be used for trimming and customizing circuits.

Figure 13A:
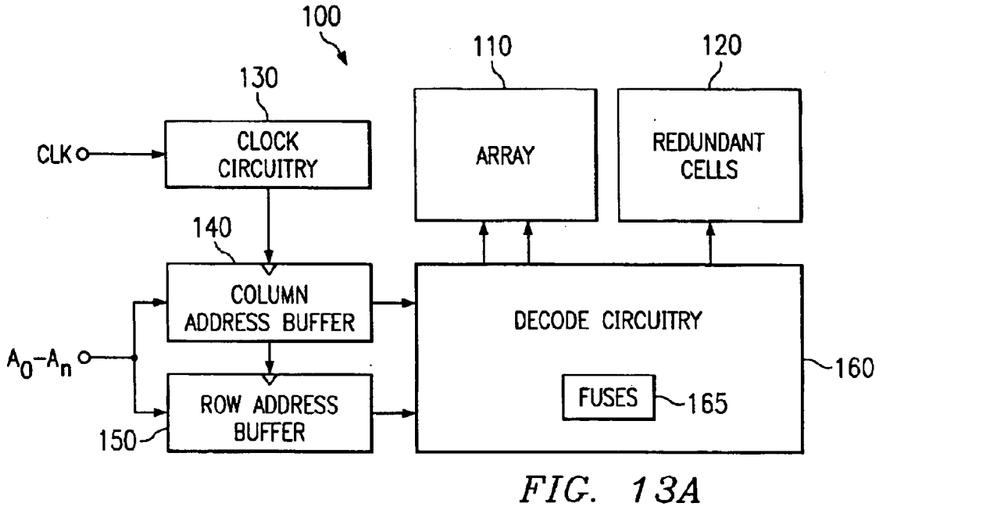
FIGS. 13a and 13b are a block diagram of a DRAM device that can utilize the teachings of the present invention.
Figure 13B:
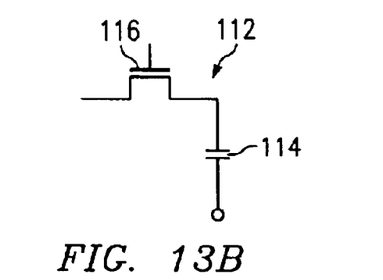

An example of one specific application that would benefit from the teachings of the present invention is shown in FIGS. 13a and 13b. These figures show a synchronous dynamic random access memory device (SDRAM) 100. While these figures illustrate an embodiment as a synchronous device, the teachings would apply equally to an asynchronous DRAM, as well as to other memories such as a static random access memory (SRAM) or a non-volatile memory such as a flash memory, EPROM (electrically programmable read only memory) or an EEPROM (electrically erasable and programmable read only memory).

The memory device 100 includes a memory array 110. Array 110 includes a plurality of memory cells 112 arranged in rows and columns. As shown in FIG. 13b, each memory cell 112 includes a capacitor 114 coupled in series with a transistor 116. The memory cell 112 may include either a stack capacitor or a trench capacitor in this invention.

The memory device 100 also includes a plurality of redundant memory cells in a redundant array 120. The cells in the redundant array 120 are preferably of the same construction of memory cells 112. The redundant array 120 may be used to replace defective rows and/or columns of memory cells in the array 110.

In operation, the memory device can be addressed with address signals A0–An (where n is an integer). These address signals are preferably received at an input pin to the DRAM device chip but could also be received from other circuitry within the same chip (e.g., in an embedded DRAM application). The address is typically received at two separate times (e.g., to reduce the number of address pins). For example, in synchronism with a first cycle of the clock signal CLK received at clock circuitry 130, a row address is input into a row address buffer 140. In synchronism with a second cycle of the clock signal CLK, a column address is input into a column address buffer 150. FIG. 13a shows the clock signal CLK being input directly into the buffers 140 and 150. It is understood that other elements may be in the address path between the pins A0–An and the buffers 140 and 150, which should not affect the fact that the buffers 140, 150 receive data at a time related to a clock signal CLK received at the clock circuitry 130.

In some applications, data is input and output from the memory device 100 at a rate that is greater than the rate of the clock signal CLK. An example of this is a double data rate (DDR) DRAM, where data may be input and/or output at both the rising and falling edge of the clock CLK.

Decode circuitry 160 is coupled to the row address buffer 140 and the column address buffer 150. Because the column address and row address are typically decoded separately, decode circuitry 160 is intended to encompass both row decoders and column decoders. The decode circuitry 160 is also coupled to the memory array 110 and the redundant memory cells 120. The decode circuitry 160 may be used to select the specific location of data that is input or output from the device 100.

As shown in the FIG. 13A, the decode circuitry 160 includes a fuse circuit 165. The fuse circuit 165 preferably includes a number of fuses as described herein. These fuses may be used to select cells from the redundant array 120 to replace defective cells in the array 110.

It will be appreciated by those skilled in the art having the benefit of this disclosure that an embodiment of this invention provides a fuse structure having a fuse material layer electrically coupling an anode contact to a cathode contact. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A programmable fuse structure formed in a semiconductor device, comprising:
    layer of fuse material;
    an anode contact at least partially bordering a first area of the fuse material layer, the anode contact abutting the fuse material layer;
    a cathode contact formed on the fuse material layer, the cathode contact covering a second area of the fuse material layer, the second area being at least partially surrounded by the first area of the fuse material layer, the cathode contact being separated from the anode contact by a spaced distance, the anode contact being electrically coupled to the cathode contact via a conductive portion of the fuse material layer, the conductive portion of the fuse material layer being within the spaced distance.

2. The fuse structure of claim 1, wherein an inner anode edge of the anode contact has a first length, wherein outer cathode edge of the cathode contact has a second length, and wherein the first length is greater than the second length.

3. The fuse structure of claim 2, wherein current crowding occurs in the fuse material layer at the outer cathode edge when electrical current flows from the anode contact to the cathode contact.

4. The fuse structure of claim 1, further comprising a cathode connector electrically coupled to the cathode contact and extending from the cathode contact to a location outside of the first area.

5. The fuse structure of claim 1, wherein the anode contact completely surrounds and borders the first area of the fuse material layer.

6. The fuse structure of claim 1, wherein the anode contact partially borders the first area of the fuse material layer.

7. The fuse structure of claim 1, wherein the anode contact borders at least about 50% of the perimeter of the first area of the fuse material layer.

8. The fuse structure of claim 1, wherein the anode contact borders at least about 75% of the perimeter of the first area of the fuse material layer.

9. The fuse structure of claim 1, wherein the spaced distance separating the cathode contact and the anode contact varies for at least two different locations along the anode contact.

10. The fuse structure of claim 1, wherein the spaced distance separating the cathode contact and the anode contact is substantially constant at different locations along the anode contact.

11. The fuse structure of claim 1, wherein the fuse material layer comprises a material selected from a group consisting of polysilicon, metal silicide, cobalt silicide, titanium silicide, tungsten silicide, tantalum silicide, platinum silicide, aluminum, tungsten, and chromium.

12. The fuse structure of claim 1, wherein the fuse material layer comprises a cobalt silicide layer and a polysilicon layer in a stacked configuration.

13. The fuse structure of claim 1, further comprising an insulation layer formed on the fuse material layer.

14. The fuse structure of claim 13, wherein the insulation layer comprises a material selected from a group consisting of silicon nitride and silicon dioxide.

15. The fuse structure of claim 1, wherein the fuse material layer is formed on insulation material of a shallow trench isolation region of the semiconductor device.

16. The fuse structure of claim 1, wherein the anode contact is generally ring shaped.

17. The fuse structure of claim 1, wherein the cathode contact is located at a central region of the fuse material layer.

18. The fuse structure of claim 1, wherein the cathode contact is not located at a central region of the fuse material layer, but is instead located on one side of the fuse material layer.

19. The fuse structure of claim 1, wherein the anode contact has a polygon-shaped inner edge, and wherein the cathode contact has a polygon-shaped outer edge.

20. A fuse structure for use in a semiconductor device, comprising:
   a layer of fuse material;
   an anode contact having a polygon-shaped outer edge and a polygon-shaped inner edge, at least a portion of the inner anode edge abutting the fuse material layer, the inner anode edge bordering a first area of the fuse material layer, the abutting portion of the inner anode edge having a first length; and
   a cathode contact having a polygon-shaped outer edge, the cathode contact being bordered by the first area of the fuse material layer, at least a portion of the outer cathode edge abutting the fuse material layer, the abutting portion of the outer cathode edge having a second length, the abutting portion of the inner anode edge being electrically coupled to the abutting portion of the outer cathode edge via a conductive portion of the fuse material layer within in the first area, wherein the first length is greater than the second length.

21. The fuse structure of claim 20, wherein current crowding occurs in the fuse material layer at the outer cathode edge when electrical current flows from the anode contact to the cathode contact.

22. The fuse structure of claim 20, further comprising:
   an insulation layer formed over the first area of the fuse material layer and over the anode contact; and
   a cathode connector electrically coupled to the cathode contact by a via and extending from the cathode contact to a location outside of the anode contact, the cathode connector being electrically insulated from the anode contact and the first area of the fuse material layer by the insulation layer where the cathode connect passes over the anode contact and the first area of the fuse material layer.

23. The fuse structure of claim 20, wherein the outer anode edge, the inner anode edge, and the outer cathode edge are each generally rectangular shaped.

24. The fuse structure of claim 23, wherein the outer cathode edge has rounded corners.

25. A fuse structure formed in a semiconductor device, comprising:
   a layer of fuse material;
   an anode contact at least partially bordering a first area of the fuse material layer, the anode contact abutting the fuse material layer; and
   a cathode contact abutting the fuse material layer, an abutting portion of the cathode contact having a second area, the second area being at least partially surrounded by the first area of the fuse material layer, the anode contact being electrically coupled to the cathode contact via a conductive portion of the fuse material layer.

26. A fuse structure formed in a semiconductor device, comprising:
   a layer of fuse material;
   a first contact at least partially bordering a first area of the fuse material layer, the first contact abutting the fuse material layer; and
   a second contact abutting the fuse material layer, an abutting portion of the second contact having a second area, the second area being at least partially surrounded by the first area of the fuse material layer, the first contact being electrically coupled to the second contact via a conductive portion of the fuse material layer.

27. The fuse structure of claim 26, wherein the first contact is an anode contact and wherein the second contact is a cathode contact.

* * * * *

UNITED STATES PATENT AND TRADEMARK OFFICE
CERTIFICATE OF CORRECTION

PATENT NO. : 6,828,652 B2
DATED : December 7, 2004
INVENTOR(S) : Kothandaraman

It is certified that error appears in the above-identified patent and that said Letters Patent is hereby corrected as shown below:

Column 10,
Line 42, insert -- an -- between "wherein" and "outer".

Signed and Sealed this

Fifth Day of April, 2005

JON W. DUDAS
*Director of the United States Patent and Trademark Office*